(12) United States Patent
Rezvani et al.

(10) Patent No.: US 6,567,031 B1
(45) Date of Patent: May 20, 2003

(54) A/D MULTI-CHANNEL ARCHITECTURE

(75) Inventors: Behrooz Rezvani, Pleasanton, CA (US); Robert A. Blauschild, Los Altos, CA (US)

(73) Assignee: Ikanos Communication, Inc., Fremont, CA (US)

( * ) Notice: Subject to any disclaimer, the term of this patent is extended or adjusted under 35 U.S.C. 154(b) by 0 days.

(21) Appl. No.: 09/715,633

(22) Filed: Nov. 17, 2000

Related U.S. Application Data
(60) Provisional application No. 60/166,069, filed on Nov. 17, 1999.

(51) Int. Cl.[7] .............................................. H03M 1/38
(52) U.S. Cl. ....................................... 341/161; 341/162
(58) Field of Search ................................ 341/161, 156, 341/118, 162, 163, 155, 158, 159

(56) References Cited

U.S. PATENT DOCUMENTS

| | | | | |
|---|---|---|---|---|
| 4,654,635 A | * | 3/1987 | Van De Plassche | 340/347 |
| 5,353,027 A | * | 10/1994 | Vorenkamp et al. | 341/156 |
| 5,635,937 A | * | 6/1997 | Lim et al. | 341/161 |
| 5,689,260 A | * | 11/1997 | Vallancourt | 341/156 |
| 6,166,675 A | * | 12/2000 | Bright | 341/162 |

* cited by examiner

Primary Examiner—Peguy JeanPierre
Assistant Examiner—Joseph Lauture
(74) Attorney, Agent, or Firm—IP Creators; Charles C. Cary

(57) ABSTRACT

An apparatus and method for A/D conversion is provided. The apparatus provides for multi-channel A/D conversion. It may be used in any application in which A/D conversion of either a single signal or multiple signal sources is required. Such applications include X-DSL communications. The apparatus and method allows A/D converters to be fabricated with reduced cost and power when compared with prior art designs. The A/D converter comprises a sampler, a converter and a logic. The sampler includes an input coupled with at least one analog information signal. The sampler repetitively provides at least one pre-sample together with a sample of the analog information signal. The sampling interval between the samples is substantially greater than a pre-sample interval between the pre-sample and the corresponding sample. The converter includes a bit line output and at least one input coupled with the output of said sampler. The converter is responsive to the pre-sample at the input to output a first bit signal corresponding to at least one significant bit of the pre-sample at the bit line output. The converter is further responsive to the sample at the input, to output a second bit signal corresponding to at least one significant bit of the sample at the bit line output. The logic is coupled with the bit line output of said converter. The logic combines the first bit signal and the second bit signal into a composite digital sample of the pre-sample together with the sample.

14 Claims, 8 Drawing Sheets

A/D MULTI-CHANNEL ARCHITECTURE

CROSS REFERENCE TO RELATED APPLICATION

This application claims the benefit of prior filed co-pending U.S. Provisional Application No. 60/166,069 filed on Nov. 17, 1999 which is incorporated herein by reference in its entirety as if fully set forth herein.

BACKGROUND OF THE INVENTION

1. Field of Invention

The field of the present invention relates in general to analog-to-digital (A/D) conversion. More particularly the present invention relates to a multi-stage multi-channel A/D converter.

2. Description of the Related Art

Analog-to-digital (A/D) converters are used in a wide variety of applications including telecommunications, radar, medical imaging, seismology, etc. There are numerous architectures for implementing A/D conversion including: flash, multi-step, pipeline, interpolating, and successive approximation The pipelined technique offers reduced circuit complexity, and power consumption with relatively high throughput. Several of these designs are shown in FIGS. 1A–C.

FIG. 1A is a block diagram of a prior art pipelined A/D converter 100 with three stages. In a pipelined architecture, the first stage operates on the most recent sample inputted while subsequent stages operate on residues from the prior samples output from prior stages of the cascaded pipeline architecture. The A/D converter includes a sample and hold unit 106; first, second, and third stages respectively 110, 120, 130; and a common clock 108. Each stage makes a digital approximation of the amplitude of the analog sample presented to it and passes the amplified residue to the next stage where the process is repeated for the next most significant bits. In operation, an analog signal (e.g., channel 1) on line 102 is delivered to a first sample and hold element 106. The first stage makes the digital approximation of the most significant bits of the sampled signal and delivers that on bit line 112. The amplified residue is presented on signal line 114 to the intermediate stage 120. The intermediate stage generates a digital approximation of the most significant bits of the residue signal, which in this case corresponds to the intermediate significant bits of the sample obtained from channel 1. These intermediate significant bits are output on bit line 122 and the amplified residue is output on signal line 124. Signal line 124 provides the input to the final stage 130 which generates a digital signal corresponding to the most significant bits of the residue. These bits correspond with the least significant bits of the original sample of channel 1. These are output on bit line 132. The composite signal in serial or parallel form with a precision determined by the combined signals on bit lines 112, 122, and 132 is presented on digital signal line 104. The common clock 108 drives each of the above-discussed components in a synchronous relationship. Each operates at the same clock speed.

As shown in FIG. 1B, each stage contains a sample and hold (SH) 158, an A/D converter (ADC) 150, a digital-to-analog converter (DAC) 156, and a differencer 154. The functions implemented by the DAC, SH and differencer may be implemented by a multiplying digital-to-analog converter (MDAC) 152. Both the ADC 150 and the differencer 154 are coupled directly to the analog signal line 114. The ADC 150 generates a signal corresponding the most significant bits of the signal received on signal line 114. This signal is provided as an output on bit line 122 as well as an input to the DAC 156. The DAC converts these most significant bits to analog form and provides them to the negative input of differencer 154. The differencer outputs a residue signal corresponding to the difference between the input signal on line 114 and the most significant bits generated by ADC 150 on bit line 122. The output of the summer is identified as a residue which is passed to the SH device 158 for output on signal line 124. The SH device includes a gain element to amplify the residue.

FIG. 1C shows a variation on the above mentioned pipelined designs. In this design the second stage works on the same signal as the first, rather than the residue of the first. Both stages accept input from the sample and hold 106. In this second design the source and sink voltages used by the second stage flash A/D converter are adjusted to a voltage window determined by the first stage. For example, if the first stage determines the sampled voltage level is between 1.2 and 1.1 volts then the second stage source and sink voltages respectively would be set to those levels by a driver 180 coupled between the first and second stages. Thus the second stage would have higher resolution than the first over a more limited range. As each new voltage is sampled the most significant bits (MSB's) of that digital voltage approximation are supplied on line 112 from the first stage. This same information received by the driver results in the alteration of source and sink voltages of the second stage by signals sent from the driver. The second stage determines the digital least significant bits (LSBs) of the input signal and passes those on signal line 184 to logic for combining the MSB from the first stage with the LSB from the second.

The main advantage of these pipelined ADCs are that they can provide high throughput rates and occupy small die areas when implemented in an integrated circuit. Both advantages stem from the concurrent operation of the stages; that is, at any time the first stage operates on the most recent sample, while all other stages operate on residues from previous samples. If the A/D are done with flash converters, pipelined architectures require only two main clock phases per conversion; therefore the maximum throughput rate can be high. Also, since the stages operate concurrently, the number of stages used to obtain a given resolution is not constrained by the required throughput rate.

For multi-channel applications, prior art pipelined A/D converters require proportionately larger die areas and have concurrently larger power dissipations.

What is needed is a A/D converter architecture with reduced die area and power dissipation for multi-channel applications.

SUMMARY OF THE INVENTION

An apparatus and method for A/D conversion is provided. The apparatus provides for multi-channel A/D conversion. It may be used in any application in which high speed A/D conversion of either a single signal or multiple signal sources is required. Such applications include X-DSL communications. The apparatus and method allows A/D converters to be fabricated with a reduced form cost and power factors when compared with prior art designs.

In an embodiment of the invention an A/D converter for obtaining digital samples from a plurality of analog information signals is disclosed. The A/D converter comprises a sampler, a converter and a logic. The sampler includes an input and an output, and the input coupled with the at least one analog information signal. The sampler repetitively provides at least, one pre-sample together with a sample of the at least one analog information signal. The sampling interval between the samples for an selected analog information signal is substantially greater than a pre-sample interval between the at least one pre-sample and the corresponding sample for the selected analog information signal. The converter includes a bit line output and at least one input coupled with the output of said sampler. The converter is responsive to the at least one pre-sample at the input to output a first bit signal corresponding to at least one significant bit of the at least one pre-sample at the bit line output. The converter is further responsive to the sample at the input, to output a second bit signal corresponding to at least one significant bit of the sample at the bit line output. The logic is coupled with the bit line output of said converter. The logic combines the first bit signal and the second bit signal into a composite digital sample of the at least one pre-sample together with the sample.

In an alternate embodiment of the invention a method for obtaining digital samples from at least one analog information signal is disclosed. The method comprises the acts of:

repetitively providing at least one pre-sample together with a sample of the at least one analog information signal, and with a sampling interval between the samples of the at least one analog information signal substantially greater than a pre-sample interval between the at least one pre-sample and the corresponding sample;

generating a first bit signal and a second bit signal, with the first bit signal corresponding to at least one significant bit of the at least one pre-sample at the bit line output, and the second bit signal corresponding to at least one significant bit of the sample at the bit line output; and combining the first bit signal and the second bit signal into a composite digital sample of the at least one pre-sample together with the sample.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION OF THE EMBODIMENTS

An apparatus and method for A/D conversion is provided. The apparatus provides for multi-channel A/D conversion. It may be used in any application in which high speed A/D conversion of either a single signal or multiple signal sources is required. Such applications include X-DSL communications. The apparatus and method allows A/D converters to be fabricated with a reduced form cost and power factors when compared with prior art designs.

Figure 2A:
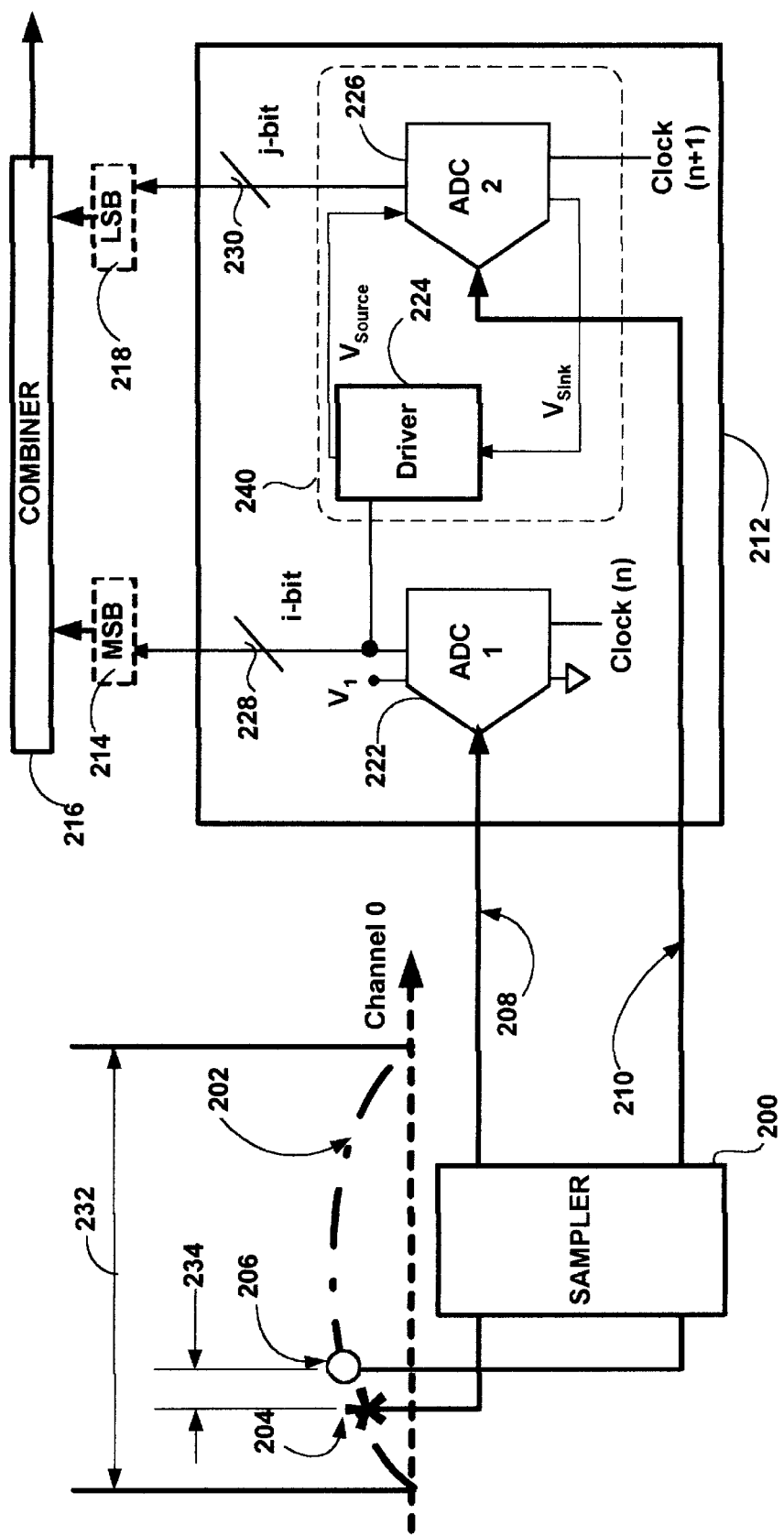
FIGS. 2A and 2B are hardware block diagrams of alternate embodiments of an A/D converter in accordance with the current invention.
Figure 2B:
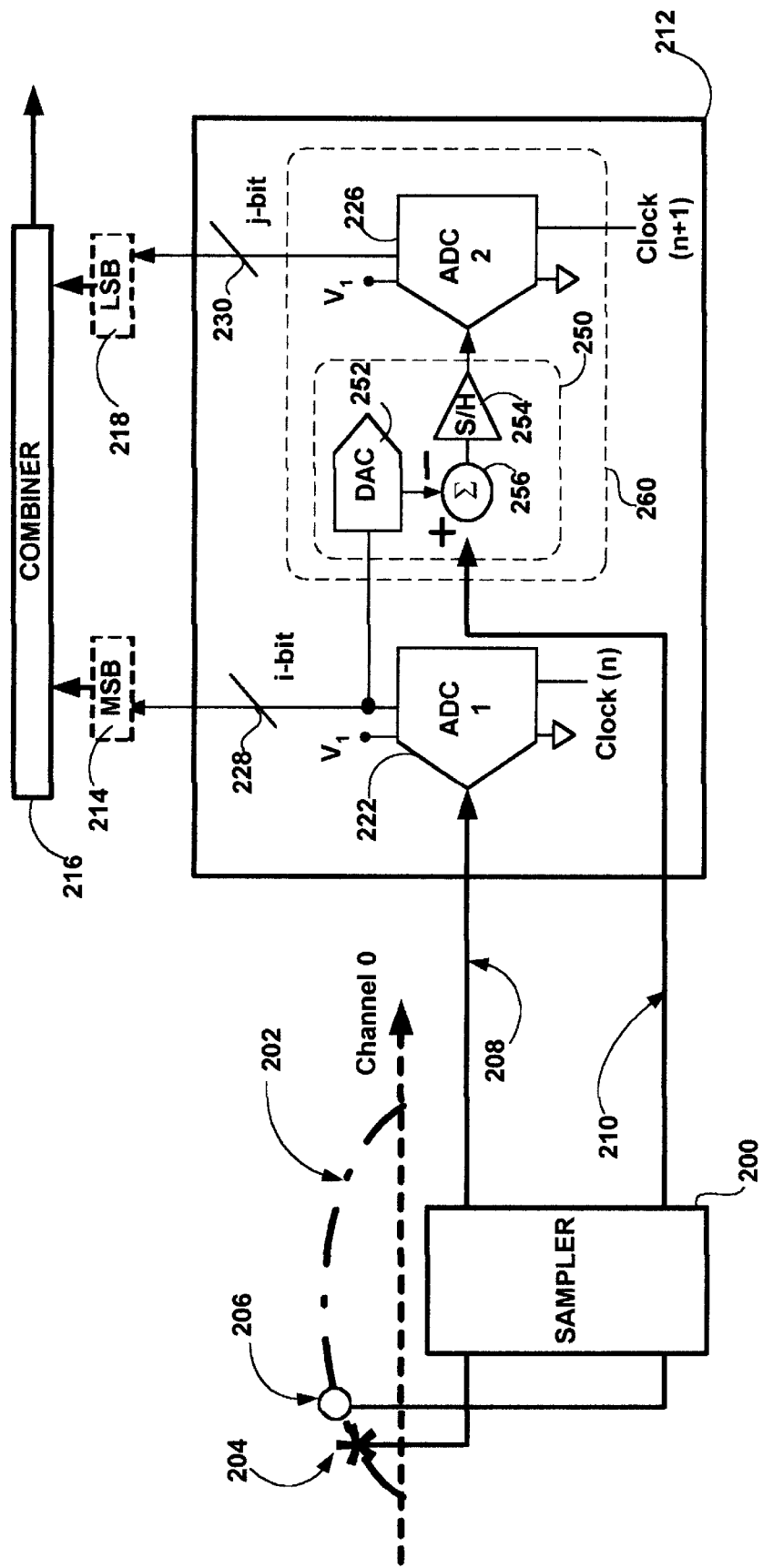

FIGS. 2A–B are hardware block diagrams of alternate embodiments of an A/D converter in accordance with the current invention.

FIG. 2A shows an embodiment of the A/D converter. A sampler 200, a converter 212, and logic block 216 for combining the outputs of the converter are shown. The converter includes at least one A/D pre-sample stage 222 and at least one A/D sample stage 240. The pre-sample stage digitizes the pre-sample, providing the most significant bit(s) 214 thereof on the first bit line 228. The at least one A/D sample stage includes a driver 224 and a flash A/D circuit 226.

In operation the sampler receives input from one or more analog information signals, e.g. signal 202. In the example shown, the sampler takes a pre-sample 204 followed by sample 206 of analog information signal 202 and does so during each sampling interval 232. The interval between the pre-sample and sample is identified as the pre-sample interval 234. The magnitude of this interval is a fraction of the sampling interval 232. In the example shown the pre-sample is output on line 208 and the sample on line 210 from the sampler. In alternate embodiments of the invention these signals may be multiplexed onto a single signal line. The analog information signal(s) may include for example one or more channels of an X-DSL communication. The sampling interval 232 corresponds to ½ or less of the period of the highest frequency component of interest in the analog information signal that is being sampled. Where the analog information signal itself includes a number of different frequency components the sampling will occur at a frequency at least twice that of the highest frequency of interest a.k.a. the Nyquist rate. The sampling interval is less than or equal to the period of the sampling frequency. During the sampling interval the waveform 202 is the subject to a pre-sample(s) 204 followed by a sample 206. The interval 234 between the pre-sample(s) and sample, is identified as the pre-sampling interval. The pre-sample interval is significantly less than the sampling interval in order that the pre-sample be an adequate predictor of the magnitude of the sample. In an embodiment of the invention the pre-sample interval is less than 25%, e.g. ¼ of the sample interval as will be explained in greater detail in the following FIGS. 4A and 4E.

In an embodiment of the invention, the pre-sample is used to set a range, or predict the range for the sample thus simplifying the circuitry required to obtain the sample and to speed up the acquisition process as well. In an embodiment of the invention more than one pre-sample may be used to determine the slope or higher order characteristics of the analog information signal waveform, to better predict the voltage range for the sample.

The input of the A/D pre-sample stage 222 receives pre-samples from the sampler on signal line 208. The pre-sample stage digitizes the input and generates an output on first bit line 228 corresponding with the most significant bit(s) 214 of the input pre-sample. The A/D sample second stage, and in particular the driver portion 224 thereof accepts the output on first bit line 228 and generates a corresponding source and sink voltage responsive thereto. The source and sink voltages are proximate in magnitude to the voltage of the pre-sample and likely to bracket that pre-sample voltage. These voltages, source and sink, are supplied to the voltage ladder portion, e.g. resistor string, of the flash A/D circuit 226. That circuit accepts as input the sample on line 210 from the sampler. Using the voltage range established by the source and sink voltages the flash A/D digitizes the sample and outputs the digitized bit(s) 218 thereof on the second bit line 230. These outputs are combined in the logic 216 for combining and outputs identified as composite digital samples are generated for each pre-sample(s) and sample sequence for one or more analog information signals. Timing of the circuit will be discussed in the following FIG. 5.

In contrast to prior art designs no sample and hold device is required to hold the inputs of the pre-sample or sample stage. Those stages each independently receive discrete signals from the sampler.

FIG. 2B shows an alternate embodiment of the invention in which the at least one A/D sample stage 260 includes a multiplying DAC 250 for determining the residue between the pre-sample and the sample. This residue provides the input to the A/D circuit from which the less significant bit(s) 218 of the composite digital samples are determined. The multiplying DAC includes a DAC 252, a summer 256 and a sample and hold 254. The DAC converts the signal on the first bit line 228 to an analog signal. The summer differences the analog signal from the DAC 252 with the sample signal on signal line 210 from the sampler 200. The residue is provided as output to sample and hold element 254. The output of the sample and hold provides input to the A/D circuit 226. The A/D circuit 226 may be implemented using a number of A/D conversion techniques including but not limited to: flash, multi-step, pipeline, interpolating, and successive approximation.

The combiner 216 shown in FIGS. 2A–B may require only a FIFO buffer delay for the MSB and summer to combine the appropriate MSB and LSB from the converter. Alternately, a digital synchronization and error correction unit may be required. The digital synchronization unit may be implemented with a plurality of buffers associated with each of the incoming channels, e.g., channels 1–4. The buffer generally serves to remove the phase and timing differences between the pre-sample and sample stages to produce an overall binary sample of each channel during each sample interval.

Alternately, both digital synchronization and digital error correction may be called for. The digital error correction unit may be required to correct for the difference in the pre-sample level vs. the sample level. The digital synchronization unit may be required to align the digitized bits corresponding with a specific pre-sample with the bits of the corresponding sample.

Figure 3:
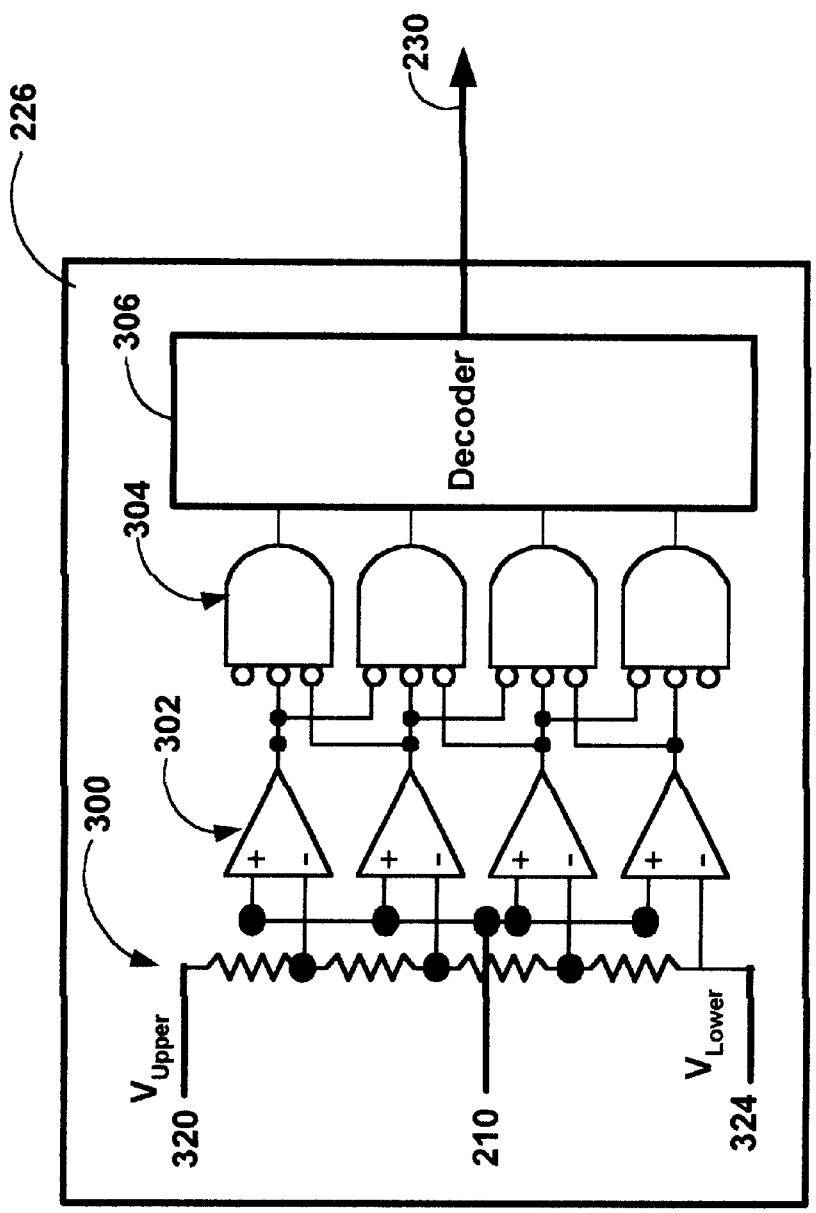
FIG. 3 is a detailed hardware block diagram of a suitable A/D sample stage for use with the embodiment of the invention shown in FIG. 2A.

FIG. 3 is a detailed hardware block diagram of a suitable A/D sample stage for use with the embodiment of the invention shown in FIG. 2A. The A/D Sample stage comprises a Flash A/D converter (See FIG. 2A reference 226). Alternate Flash structures well known to those skilled in the art may be utilized with equal advantage for this portion of the A/D converter. The Flash A/D converter includes a resistor string 300, comparators 302, nand gates 304 and a decoder 306. The upper and lower portions of the resistor string are coupled via signal lines 320,324 to the source and sink outputs respectively of the driver 224 shown in FIG. 2A. Once these voltages are determined based on the pre-sample, the sample is input via signal line 210 (See FIG. 2A) to the comparator string 302. The comparators and nand gates determine the voltage level of the input sample and the decoder decodes the output into digitized bits 218 (See FIG. 2A) which are output on the second bit signal on second bit line 230.

Figure 4A:
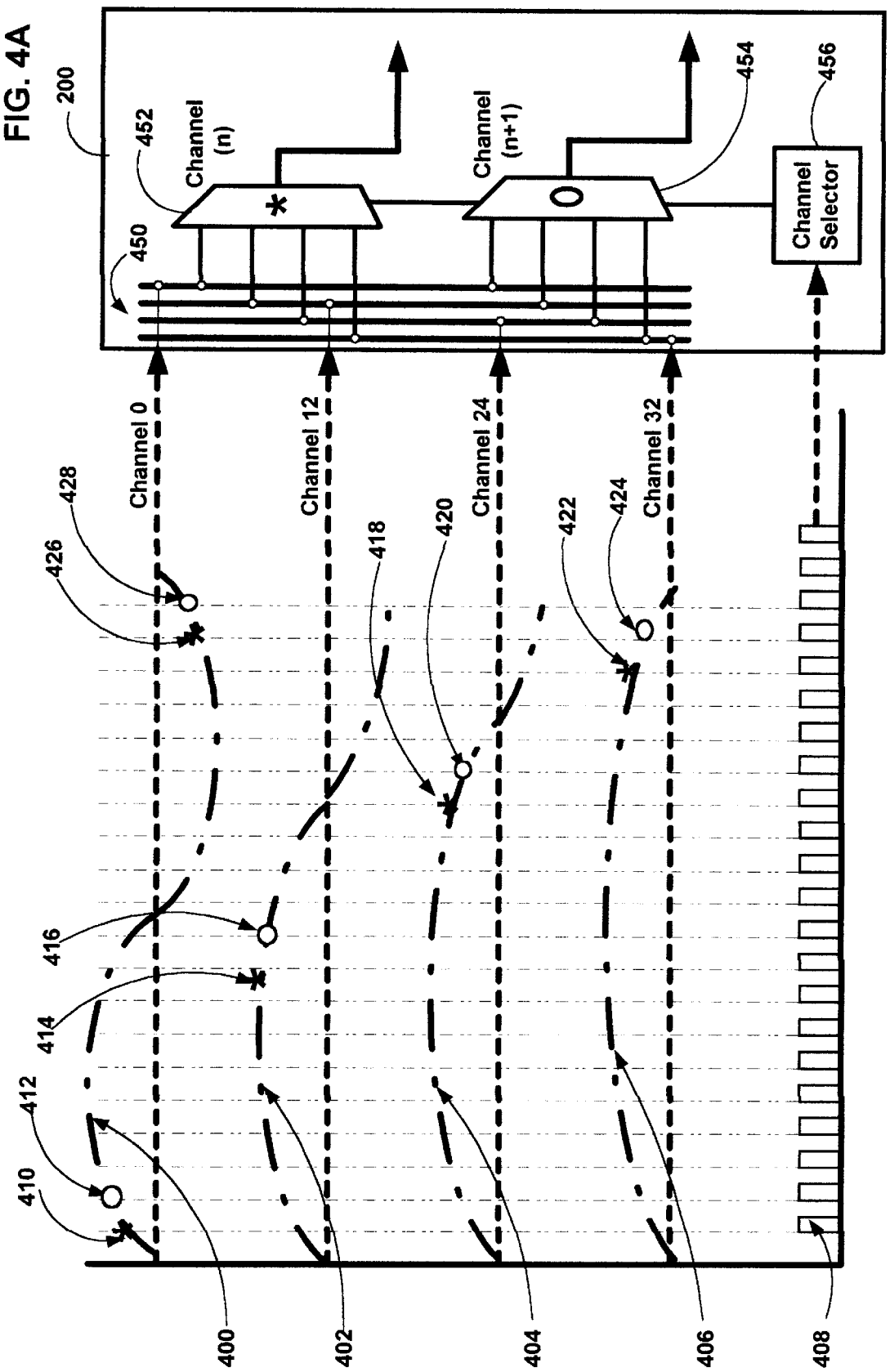
FIG. 4A is a combined signal and hardware block diagram showing an embodiment of the sampler 200 See FIGS. 2A–B for handling multiple analog information signal inputs.

FIG. 4A is a combined signal and hardware block diagram showing an embodiment of the sampler 200 (See FIGS. 2A–B) for handling multiple analog information signal inputs. These may for example correspond with multiple X-DSL channels. The channels themselves may comprise more than one of the X-DSL protocols: G.Lite, ADSL, VDSL, SDSL, MDSL, RADSL and HDSL. Instead they may comprise multiple of the protocols as shown in the signal diagram portion of FIG. 4A.

Figure 1A:
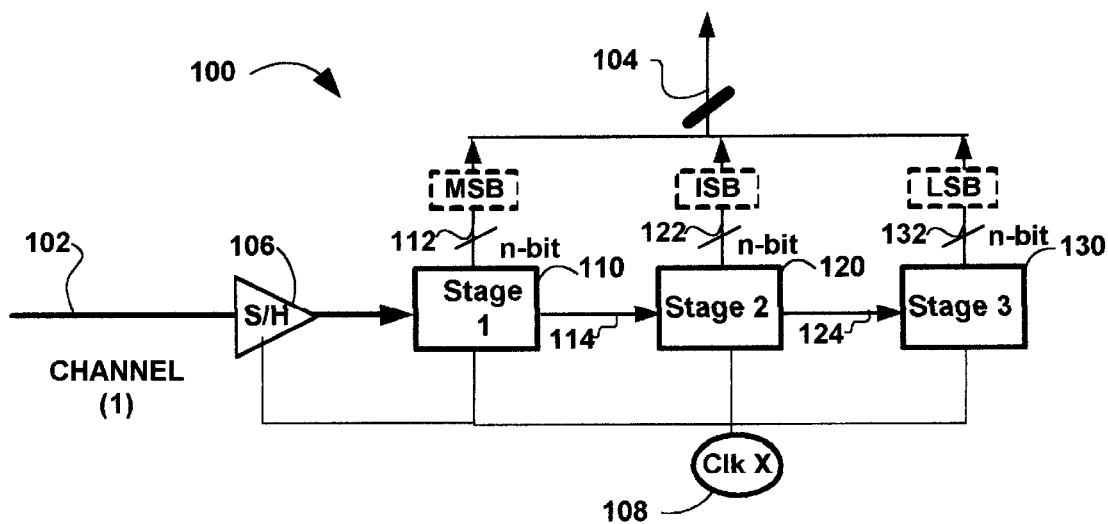
FIGS. 1A–C show a prior art implementation of a single-path multi-stage analog-to-digital (A/D) converter.
Figure 1B:
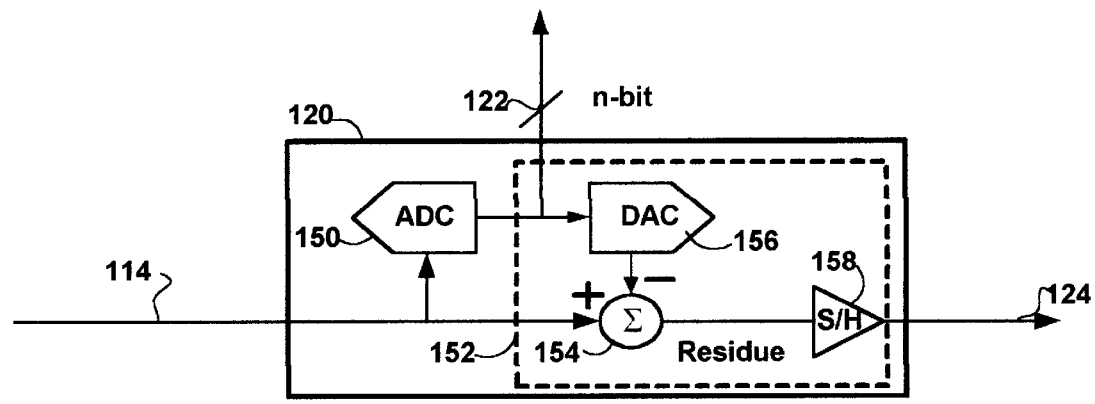
Figure 1C:
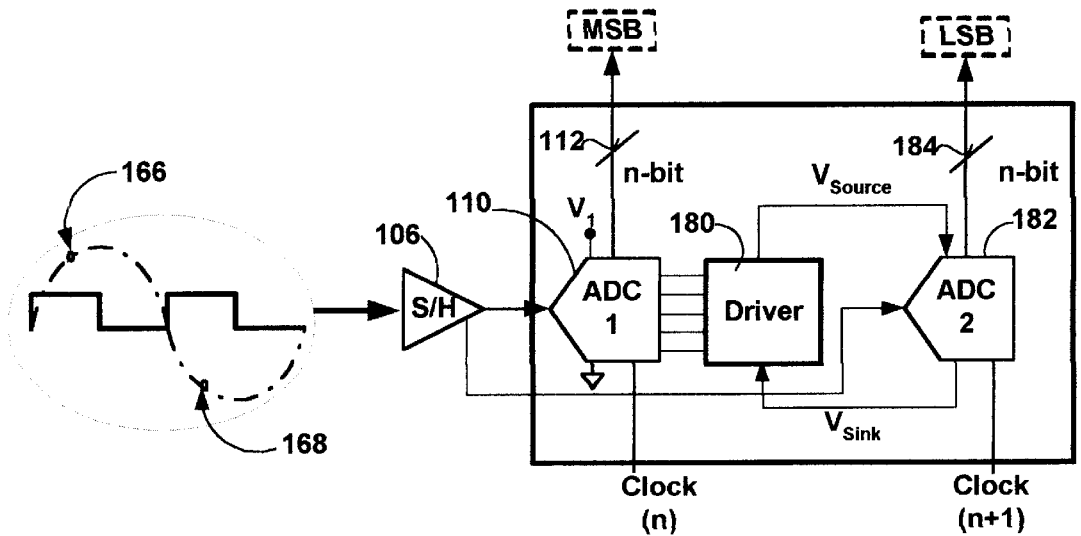

In the example shown the sampler includes a pre-sample multiplexer 452 and a sample multiplexer 454 for obtaining the analog pre-samples and samples respectively. Each multiplexer has inputs coupled to a bus 450 the discrete signal lines of which carry the discrete analog information signals. The multiplexers are driven by channel selector 456 which operates of a clock 408. In the signal diagram portion the clock signal 408 is shown in relation to four channels 400–406 of analog information signals. These analog information signals have different bandwidth, i.e. require sampling at increasing frequencies with channel 400 requiring the highest sampling rate and channel 406 the lowest. Channel 400 in an X-DSL context might correspond to a VDSL channel while channel 406 might correspond to a G.Lite channel. Sampling of all channels occurs in a round robin or other desired sequence through all input channels. Within each round robin interval channels are sampled, i.e. pre-sample(s) and sample, at a frequency which corresponds with their bandwidth. Thus in the example shown channel 400 is pre-sampled and sampled twice. The first pre-sample 410 is followed by sample 412, the next pre-sample 426 is followed by sample 428. Channel 402 is pre-sampled and sampled once. The pre-sample 414 is followed by sample 416. Channel 404 is pre-sampled and sampled once. The pre-sample 418 is followed by sample 420. Channel 406 is pre-sampled and sampled once. The pre-sample 422 is followed by sample 424. Sample 424 may occur on the same clock cycle as the pre-sample 426 of channel 400 discussed above. This is made possible by the nature of the stages discussed above in FIGS. 2A–B in which each accepts independent input. Normally, one would associate inaccuracy of result with the pre-sampling and sampling of a waveform, when the desired result is a single composite digital sample. The pre-sample and sample are after all acquired at different times. However, if multiple channels are being used as input and if the number of channels is large in relation to the required sampling rate of any one channel then the interval between pre-sample and sample can be reduced to the point where accuracy is no longer an issue. With the stages split as shown in FIGS. 2A–B the independent processing of the pre-sample(s) and sample may be accomplished. This allows faster throughput and avoids the need for an input sample and hold device such as is required in prior art designs such as those shown in FIGS. 1A–C.

Figure 4B:
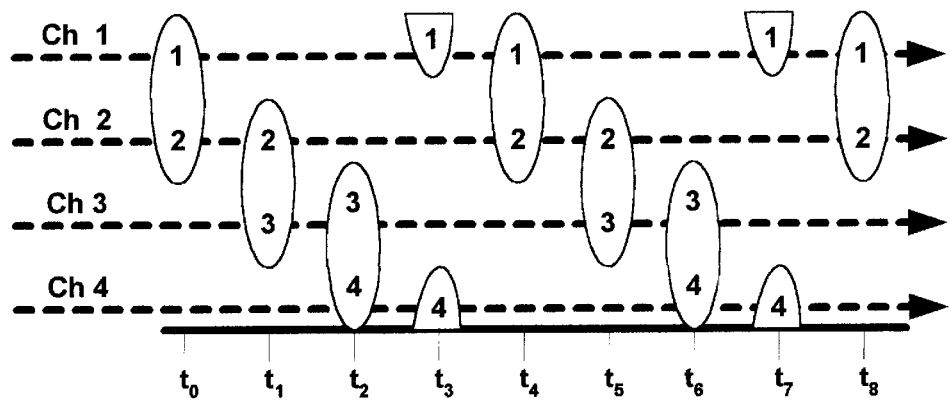
FIGS. 4B–C are graphs showing the sequencing of pre-samples and samples for each of a plurality of analog information signals.
Figure 4C:
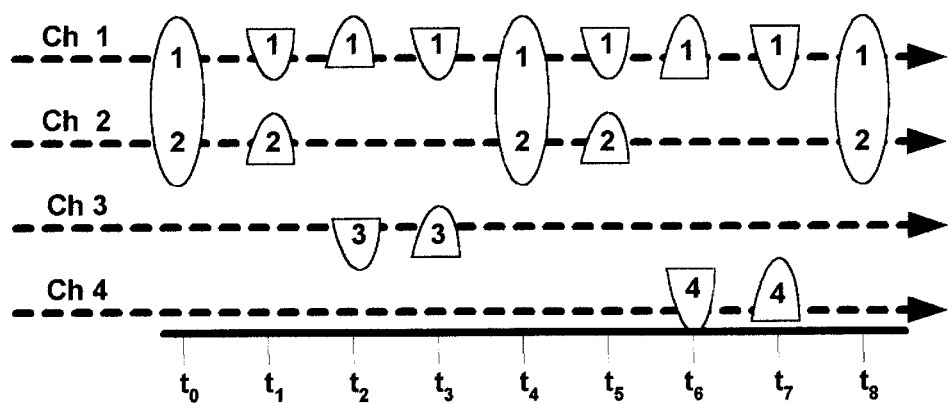

FIGS. 4B–C are graphs showing the sequencing of pre-samples and samples for each of a plurality of analog information signals. Each ellipse corresponds with a sample interval and the numbers within each ellipse show the channels from which pre-sample(s) followed by sample are obtained. In FIG. 4B bandwidth requirements for each of channels 1–4 are substantially equal. In FIG. 4C Channel 1 has twice the bandwidth requirement of Channel 2, which in turn has twice the bandwidth requirement of either channels 3 or 4.

Figure 4E:
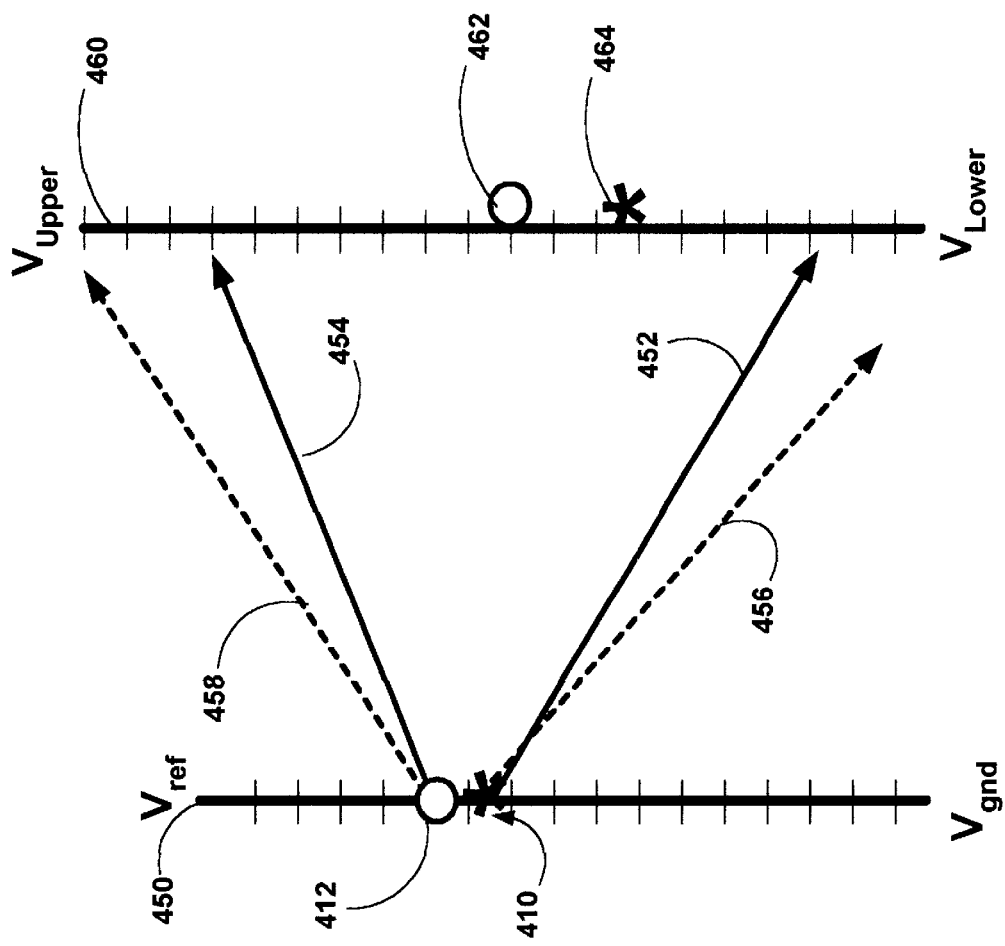
FIG. 4E is a graph showing a voltage ladder representation of the operation of an embodiment of the A/D converter shown in FIG. 2A.
Figure 4D:
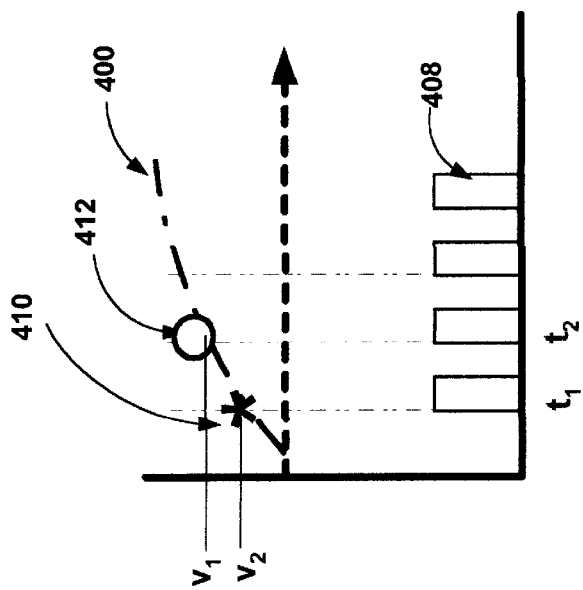
FIG. 4D is a detailed view of one pre-sample and sample sequence shown in FIG. 4A.

FIG. 4D is a detailed view of one pre-sample and sample sequence shown in FIG. 4A. The pre-sample 410 at voltage level $V_2$ followed by the sample at voltage level $V_1$ is shown.

FIG. 4E is a graph showing a voltage ladder representation of the operation of an embodiment of the A/D converter shown in FIG. 2A Voltage ladder 450 corresponds to the voltage levels within the A/D pre-sample stage 222 (See FIG. 2A). Voltage ladder 460 corresponds to the voltage levels within the A/D sample stage 226 (See FIG. 2A). Based on the voltage level of the pre-sample 410 a projection of the source and sink voltage range 452–454 is made by the driver 224 (See FIG. 2A). That projection may be based on one or more pre-samples. Where one pre-sample is all that is acquired the source and sink range is extended to source and sink voltages 458–456 respectively to account for the possibility that the analog sample has gone beyond the digitized range for the pre-sample during the pre-sample interval. Where more than one pre-sample is available projections based on slope of the pre-samples or rate of change of such slope may enable the more accurate ranging of the source and sink voltages for the Flash A/D converter 226 (See FIG. 2A). In the example shown the projection results in source and sink voltage projections 458 and 456 that overlap the next higher and next lower voltages determined by the pre-sample stage.

Figure 5:
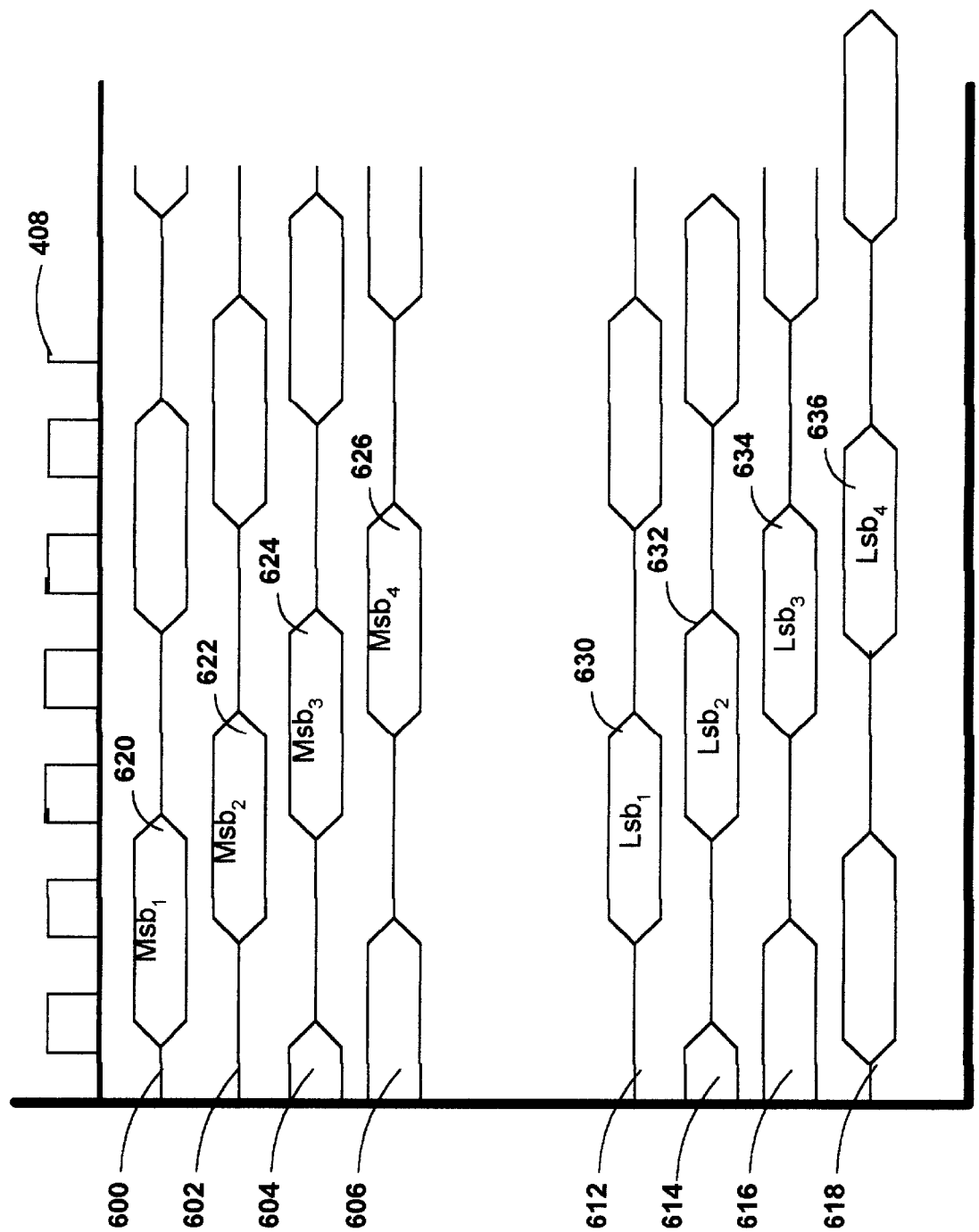
FIG. 5 is a timing diagram for the multi-channel A/D converter shown in FIGS. 2A–B.

FIG. 5 is a timing diagram for the multi-channel A/D converter shown in FIGS. 2A–B. Processing of any given channel is sequential, with the MSB outputs 600–606 of the various channels being processed appearing on the first bit line 228 (See FIGS. 2A–B and the LSB outputs 612–618 of the various channels being processed appearing on the second bit line 230 (See FIG. 2). In the example shown, the most significant bits 620 of channel 1 are followed in staggered fashion by the most significant bits of channels 2, 3, and 4 in packets 622–626, respectively. These are all obtained from pre-samples. The LSB's are provided one or more clock cycles later in packets 630–636. Alternate timing arrangements may be implemented without departing from the scope of the invention.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A multi-channel analog-to-digital converter for digitizing a plurality of analog information channels each of which exhibit a corresponding highest frequency component of interest at least two of which differ from one another, and the multi-channel analog-to-digital converter comprising:

at least one multiplexer with a plurality of inputs each coupled to a corresponding one of the plurality of analog information channels, and the at least one multiplexer switchably coupled to each of the plurality of inputs to provide a multiplexed sequence of pre-samples and samples from the plurality of analog information channels;

a channel selector coupled to the at least one multiplexer to drive selection thereby of sequential ones of the plurality of analog information channels to generate the multiplexed sequence of at least one pre-sample and the sample for each of the plurality of analog information channels at rates corresponding with at least twice a highest frequency component of interest within each of the plurality of analog information channels;

at least two analog-to-digital conversion stages pipeline coupled to one another for pipelined analog-to-digital conversion of the multiplexed sequence from the at least one multiplexer with a first of the at least two analog-to-digital conversion stages converting each at least one pre-sample from the plurality analog information channels to at least one significant bit and a second of the at least two analog-to-digital conversion stages utilizing the at least one significant bit from the first of the at least two analog-to-digital stages to convert each corresponding sample from the plurality of analog information channels to at least a successive significant bit; and logic coupled to the at least two analog-to-digital conversion stages to repetitively combine each at least one significant bit from each corresponding at least one pre-sample with the at least successive significant bit from each corresponding sample to form composite digital samples for each of the plurality of analog information channels.

2. A multi-channel analog-to-digital converter for digitizing a plurality of analog X-DSL communication channels, and the multi-channel analog-to-digital converter comprising:

at least one multiplexer with a plurality of inputs each coupled to a corresponding one of the plurality of analog X-DSL communication channels, and the at least one multiplexer switchably coupled to each of the plurality of inputs to provide a multiplexed sequence of pre- samples and samples from the plurality of analog X-DSL communication channels;

at least two analog-to-digital conversion stages pipeline coupled to one another for pipelined analog-to-digital conversion of the multiplexed sequence from the at least one multiplexer with a first of the at least two analog-to-digital conversion stages converting each at least one pre-sample from the plurality analog X-DSL communication channels to at least one significant bit and a second of the at least two analog-to-digital conversion stages utilizing the at least one significant bit from the first of the at least two analog-to-digital stages to convert each corresponding sample from the plurality of analog X-DSL communication channels to at least a successive significant bit; and logic coupled to the at least two analog-to-digital conversion stages to repetitively combine each at least one significant bit from each corresponding at least one pre-sample with the at least successive significant bit from each corresponding sample to form composite digital samples for each of the plurality of analog X-DSL communication channels.

3. The multi-channel analog-to-digital converter of claim 2, wherein the X-DSL communication channels exhibit at least two X-DSL protocols including G.Lite, ADSL, VDSL, SDSL, MDSL, RADSL and HDSL.

4. A multi-channel analog-to-digital converter of claim 2, wherein the at least one pre-sample includes an initial pre-sample and a subsequent pre-sample, and wherein further the first of the at least two analog-to-digital conversion stages further comprises:

logic for determining a magnitude of the at least one significant bit based on both the initial pre-sample and the subsequent pre-sample.

5. The multi-channel analog-to-digital converter of claim 2, wherein the second of the at least two analog-to-digital conversion stages further comprises:

a driver with an input and a pair of control outputs, and the driver responsive to the at least one significant bit from the conversion of the at least one pre-sample by the first of the at least two analog-to-digital stages at the input to generate a source voltage and a sink voltage at corresponding ones of the pair of control outputs, with the source and sink voltages correlating with an expected voltage range for processing the corresponding sample; and a flash analog-to-digital circuit with a voltage ladder portion, a sample input and an output, and with opposing ends of the voltage ladder portion coupled to the pair of control outputs of the driver for determining the voltage range for processing the corresponding sample, and the flash analog-to-digital converter responsive to the corresponding sample at the sample input to output at least the successive significant bit thereof at the output.

6. The multi-channel analog-to-digital converter of claim 2, wherein the second of the at least two analog-to-digital conversion stages further comprises:

a multiplying digital-to-analog converter with a bit input, a sample input and an output, and the multiplying digital-to-analog converter responsive to the at least one significant bit from the first of the at least two analog-to-digital conversion stages at the bit input and the corresponding sample at the sample input to output a residue thereof at the output; and an analog-to-digital circuit with an input coupled to the output of the multiplying digital-to-analog converter and an output, and the analog-to-digital circuit responsive to the residue at the input to output the second bit signal corresponding to at least the successive significant bit of the residue at the output.

7. A multi-channel analog-to-digital converter for digitizing a plurality of analog information channels, and the multi-channel analog-to-digital converter comprising:

at least one multiplexer with a plurality of inputs each coupled to a corresponding one of the plurality of analog information channels, and the at least one multiplexer switchably coupled to each of the plurality of inputs to provide a multiplexed sequence of pre-samples and samples from the plurality of analog information channels;

a channel selector coupled to the at least one multiplexer to drive selection thereby of sequential ones of the plurality of analog information channels to include in the multiplexed sequence of pre-samples and samples at least one pre-sample and a following sample during a sampling interval which corresponds with less than half a period of the highest frequency component of interest for each of the plurality of analog information channels, and wherein further a pre-sample interval between the at least one pre-sample and the following sample corresponds with less than ¼ of the sampling interval for each of the plurality of analog information channels;

at least two analog-to-digital conversion stages pipeline coupled to one another for pipelined analog-to-digital conversion of the multiplexed sequence from the at least one multiplexer with a first of the at least two analog-to-digital conversion stages converting each at least one pre-sample from the plurality analog information channels to at least one significant bit and a second of the at least two analog-to-digital conversion stages utilizing the at least one significant bit from the first of the at least two analog-to-digital stages to convert each corresponding sample from the plurality of analog information channels to at least a successive significant bit; and logic coupled to the at least two analog-to-digital conversion stages to repetitively combine each at least one significant bit from each corresponding at least one pre-sample with the at least successive significant bit from each corresponding sample to form composite digital samples for each of the plurality of analog information channels.

8. A method for obtaining digital samples from a plurality of analog information channels each of which exhibit a corresponding highest frequency component of interest at least two of which differ from one another, and the method comprising:

switchably coupling to each of the plurality of analog information channels to provide a multiplexed sequence of at least one pre-sample and a sample for each of the plurality of analog information channels at rates corresponding with at least twice a highest frequency component of interest within each of the plurality of analog information channels;

converting the multiplexed sequence from analog-to-digital in at least two pipelined analog-to-digital conversion stages, with each at least one pre-sample converted to at least one significant bit in a first of the at least two pipelined analog-to-digital conversion stages and with each sample converted to at least a successive significant bit in a second of the at least two pipelined analog-to-digital conversion stages, utilizing the at least one significant bit from the conversion of the corresponding at least one pre-sample; and repetitively combining each at least one significant bit from each corresponding at least one pre-sample with the at least successive significant bit from each corresponding sample to form composite digital samples for each of the plurality of analog information channels.

9. A method for obtaining digital samples from a plurality of analog X-DSL communication channels, and the method comprising:

switchably coupling to each of the plurality of analog X-DSL communication channels to provide a multiplexed sequence of pre-samples and samples there from;

converting the multiplexed sequence from analog-to-digital in at least two pipelined analog-to-digital conversion stages, with each at least one pre-sample converted to at least one significant bit in a first of the at least two pipelined analog-to-digital conversion stages and with each sample converted to at least a successive significant bit in a second of the at least two pipelined analog-to-digital conversion stages, utilizing the at least one significant bit from the conversion of the corresponding at least one pre-sample; and repetitively combining each at least one significant bit from each corresponding at least one pre-sample with the at least successive significant bit from each corresponding sample to form composite digital samples for each of the plurality of analog X-DSL communication channels.

10. The method of claim 9, wherein the X-DSL communication channels exhibit at least two X-DSL protocols including G.Lite, ADSL, VDSL, SDSL, MDSL, RADSL and HDSL.

11. The method of claim 9, wherein the multiplexed sequence includes two pre-samples together with each sample for each of the plurality of analog X-DSL communication channels and wherein the switchably coupling act further comprises the act of:

determining a magnitude of the at least one significant bit on the basis of the two pre-samples.

12. The method of claim 9, wherein the converting act further comprises the acts of:

generating from the at least one significant bit of each at least one pre-sample both a source voltage and a sink voltage with magnitudes which correspond with a voltage range for processing the corresponding sample in the second of the at least two pipelined analog-to-digital stages; and processing the corresponding sample in the second of the at least two pipelined analog-to-digital stages at the voltage range generated in the generating act to determine the at least successive significant bit.

13. The method of claim 9, wherein said converting act further comprises the acts of determining a residue between the at least one significant bit of each at least one pre-sample and the corresponding sample for each of the plurality of analog X-DSL communication channels; and generating the at least successive significant bit for each of samples from the residue determined in said act of determining.

14. A method for obtaining digital samples from a plurality of analog information channels, and the method comprising:

switchably coupling to each of the plurality of analog information channels to provide a multiplexed sequence of pre-samples and samples there from having successive samples of each of the plurality of analog information channels separated from one another by a sampling interval, with the sampling interval for each of the plurality of analog information channels corresponding with less than half of a period of a highest frequency of interest of the corresponding one of the plurality of analog information channels; and with the at least one pre-sample and the sample for each of the plurality of analog information channels separated by a pre-sample interval, with the pre-sample interval corresponding with less than ¼ of the sampling interval for each of the plurality of analog information channels;

converting the multiplexed sequence from analog-to-digital in at least two pipelined analog-to-digital conversion stages, with each at least one pre-sample converted to at least one significant bit in a first of the at least two pipelined analog-to-digital conversion stages and with each sample converted to at least a successive significant bit in a second of the at least two pipelined analog-to-digital conversion stages, utilizing the at least one significant bit from the conversion of the corresponding at least one pre-sample; and repetitively combining each at least one significant bit from each corresponding at least one pre-sample with the at least successive significant bit from each corresponding sample to form composite digital samples for each of the plurality of analog information channels.

* * * * *